(12) United States Patent
Christoffers et al.

(10) Patent No.: US 8,131,245 B2
(45) Date of Patent: Mar. 6, 2012

(54) MIXER FOR DOWNCONVERSION OF RF SIGNALS

(75) Inventors: Niels Christoffers, Cambridge (GB); Nicolas Sornin, Nice (FR)

(73) Assignee: Cambridge Silicon Radio Limited, Cambridge (GB)

( * ) Notice: Subject to any disclaimer, the term of this patent is extended or adjusted under 35 U.S.C. 154(b) by 1181 days.

(21) Appl. No.: 11/855,100

(22) Filed: Sep. 13, 2007

(65) Prior Publication Data

US 2009/0075621 A1    Mar. 19, 2009

(51) Int. Cl.
*H04B 1/18* (2006.01)
(52) U.S. Cl. ........ 455/293; 455/284; 455/295; 455/296; 455/326; 455/333; 324/601; 330/260
(58) Field of Classification Search .................. 455/296, 455/323, 284, 293, 295, 326, 333; 324/601; 330/260
See application file for complete search history.

(56) References Cited

U.S. PATENT DOCUMENTS

| | | | | |
|---|---|---|---|---|
| 5,613,233 A * | 3/1997 | Vagher | | 455/296 |
| 6,438,365 B1 * | 8/2002 | Balteanu | | 455/326 |
| 6,992,519 B2 * | 1/2006 | Vilander et al. | | 327/359 |
| 7,259,569 B2 * | 8/2007 | Kim | | 324/601 |
| 7,719,361 B2 * | 5/2010 | Pera | | 330/260 |
| 2005/0255825 A1 * | 11/2005 | Takagi | | 455/341 |
| 2006/0040636 A1 * | 2/2006 | Lin | | 455/323 |

OTHER PUBLICATIONS

Ramiah et al., "High Linearity 0.18 micron CMOS Mixer with Current Draining Technique," TENCON 2005, Melbourne, Australia, Nov. 21, 2005.
Brandolini et al.,"A 750 mV Fully Integrated Direct Conversion Receiver Front-End for GSM in 90-nm CMOS," IEEE Journal of Solid-State Circuits, Jun. 2007, vol. 42, No. 6, pp. 1310-1317.

* cited by examiner

*Primary Examiner* — Junpeng Chen
(74) *Attorney, Agent, or Firm* — Novak Druce DeLuca + Quigg LLP

(57) ABSTRACT

A mixer for downconversion of RF signals includes at least one RF transistor (305); at least one switching pair (303) connected to the drain current (301) of the at least one RF transistor (305); and a common mode sensing component (300) configured to detect deviations in the common mode output of the switching pair (303) from a specified output; wherein the deviations modify the current of the at least one switching pair (303).

7 Claims, 6 Drawing Sheets

MIXER FOR DOWNCONVERSION OF RF SIGNALS

FIELD OF THE INVENTION

The present invention is related to a mixer for downconversion of RF (radio frequency) signals. The invention is particularly but not exclusively related to a mixer which reduces second order distortion using a common mode feedback loop.

BACKGROUND

Second order intermodulation distortion (IM2) in mixers is caused by self mixing within the mixer.

Second order components from the self mixing are within low frequency bands where they can superpose desired signals and can therefore aggravate subsequent signal processing.

Some mixers, such as Gilbert-type mixers, have a differential output such that IM2 exists as a removable common-mode signal when both individual output paths are identical. However, due to duty-cycle errors as a consequence of mismatches in the switching transistors, the IM2 in the common mode of the RF-input transistors leaks into the differential mode at the mixer output.

It is object of the present invention to provide a mixer which reduces second order distortion, or at least provides a useful alternative.

SUMMARY OF THE INVENTION

According to a first aspect of the invention there is provided a mixer for downconversion of RF signals, comprising:
at least one RF transistor;
at least one switching pair connected to the drain current of the at least one RF transistor; and
a common mode sensing component configured to detect deviations in the common mode output of the switching pair from a specified output;
wherein the deviations modify the current of the at least one switching pair.

Preferably the mixer further comprises a feedback path from the common mode sensing component to the drain current of the RF transistor. The feedback path may be configured to subtract the deviation from the drain current of the RF transistor. The deviation may be amplified before being subtracted from the drain current.

The mixer may comprise a separate feedback path from the common mode sensing component to the drain current of each RF transistor.

The mixer may further comprise an amplifier configured to amplify the deviation before being subtracted from the drain currents.

When there are two or more RF transistors, the gains of each feedback path may be mismatched to each RF transistor.

The deviation may modify the current by direct subtraction of the deviation from the drain current of the RF transistor.

Alternatively, the deviation may modify the current by modifying the gate-source voltage of the RF transistor.

The common mode sensing component may comprise a resistive divider and a PMOS-transistor.

The specified output may be a ground reference defined voltage.

According to a first aspect of the invention there is provided a method for reducing second order distortion in a downconversion mixer, including the steps of:
detecting deviations in the common mode output of at least one switching pair from a specified output; and
modifying the current of the at least one switching pair.

BRIEF DESCRIPTION OF THE DRAWINGS

Embodiments of the invention will now be described, by way of example only, with reference to the accompanying drawings in which.

DETAILED DESCRIPTION OF PREFERRED EMBODIMENTS

The present invention provides a mixer which reduces second order distortion (IM2) by modifying current of switching pairs within the mixer by using the deviation of the common mode of the mixer from a specified CM-current.

Figure 1:
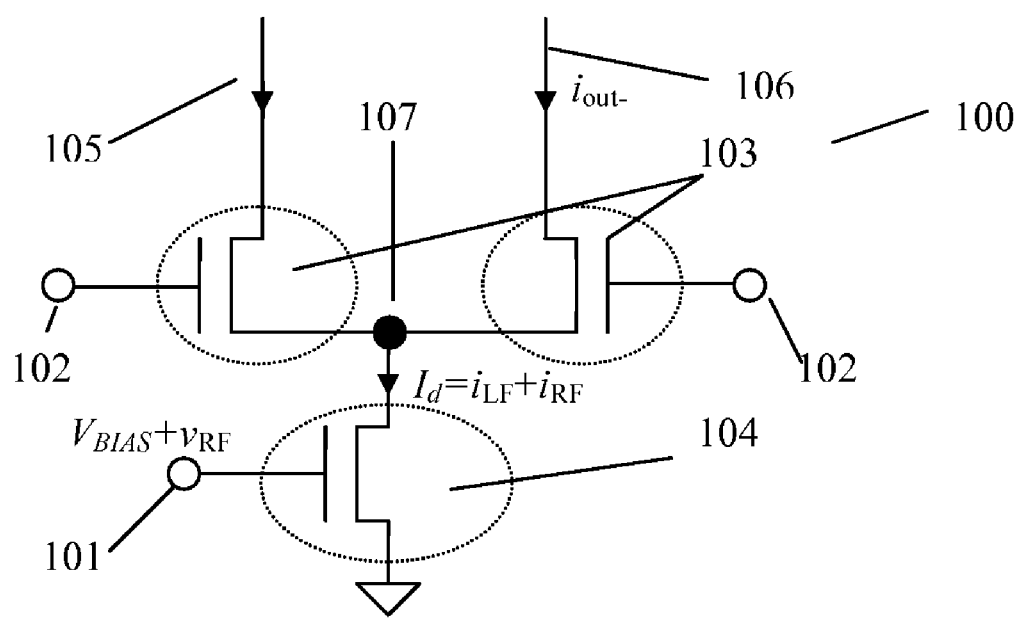
FIG. 1: shows a simplified single balanced Gilbert mixer.

Referring to FIG. 1, an explanation of how IM2 is generated will be provided. A simplified single-balanced mixer 100 is shown in FIG. 1 which is unbalanced at its RF-input 101 ($V_{bias}$ superimposed by the RF-voltage $v_{RF}$) and normally balanced at its LO-input 102 ($v_{lo+}$ to $v_{lo-}$). The LO-input 102 voltage connected to two switching transistors 103 is assumed to be high enough to steer the total drain current of the RF-input transistor 104 to either the positive 105 or negative 106 output branch of the mixer during the first or second half of the LO-period respectively. The drain-current 107 of the input transistor comprises a low-frequency component $i_{LF}$ and a high-frequency component $i_{RF}$. The RF component will be mixed to the RF-frequency plus and minus the LO-frequency. Most of the LF-component will be mixed to the LO frequency. However, a part of it will leak to the output of the mixer in case of a non-50% duty cycle of the switches.

Let the LF component vary slow enough to be regarded constant during one LO-period. Assuming moreover the point in time during a period of the LO where the switches switch the RF-current from the positive to the negative branch is denoted $T_S$ the LF content of the differential output current will be $$0.5 \cdot \overline{i_{out+} - i_{out-}} = 0.5 \cdot \frac{1}{T} \cdot \left[ \int_0^{T_s} i_{out+} dt - \int_{T_s}^T i_{out-} dt \right] \quad (1)$$

$$= 0.5 \cdot \left( \underbrace{i_{LF} \frac{2T_s - T}{T}}_{=i_{undesired}} + \underbrace{\frac{\int_0^{T_s} i_{rf} dt - \int_{T_s}^T i_{rf} dt}{T}}_{=i_{desired}} \right)$$

where the over-bar indicates the time average and T is the LO-Period, and the low-pass filtering has been approximated by an averaging across one LO-cycle.

The desired current in Equation (1), denoted $i_{desired}$, arises from mixing the RF-frequency with the LO-frequency, and will be superposed by an undesired component $i_{undesired}$, which arises from leakage of the low-frequency currents to the mixer output. The leakage will be zero for $2 \cdot T_s = T$, i.e. a 50% duty cycle. Practically, an exact 50% duty cycle cannot be achieved, such that leakage is inevitable.

The LF-components can be computed using a transistor model, for instance that of Schichman and Hodges. For the circuit of FIG. 1 the drain-current of the input transistor will be:

$$I_d = 0.5 \cdot \mu \cdot C_{OX} \cdot W/L \cdot (V_{bias} + v_{rf} - V_T)^2$$
$$= 0.5 \cdot \mu \cdot C_{OX} \cdot W/L \cdot [(V_{bias} - V_t)^2 + 2 \cdot (V_{bias} - V_t) \cdot v_{rf} + v_{rf}^2]$$
$$= I_{bias} + i_{rf} + g_{m2} \cdot v_{rf}^2$$

With $$I_{bias} = 0.5 \cdot \mu \cdot C_{ox} \cdot W/L \cdot (V_{bias} - V_t)^2$$

$i_{rf} = g_m \cdot v_{rf}$, where $g_m = \mu \cdot C_{ox} \cdot W/L \cdot (V_{bias} - V_t)$ $$g_{m2} = 0.5 \cdot \mu \cdot C_{ox} \cdot W/L$$

The squared input voltage $v_{rf}^2$ comprises LF and RF components. Let the LF components be denoted $LP\{v_{rf}^2\}$. The LF component of $I_d$ will hence be $$i_{LF} = g_{m2} \cdot LP\{v_{rf}^2\}$$

Thus it is:

$$i_{undesired} = 0.5 \cdot g_{m2} \cdot LP\{v_{rf}^2\} \frac{2T_s - T}{T} \quad (7)$$

Figure 2:
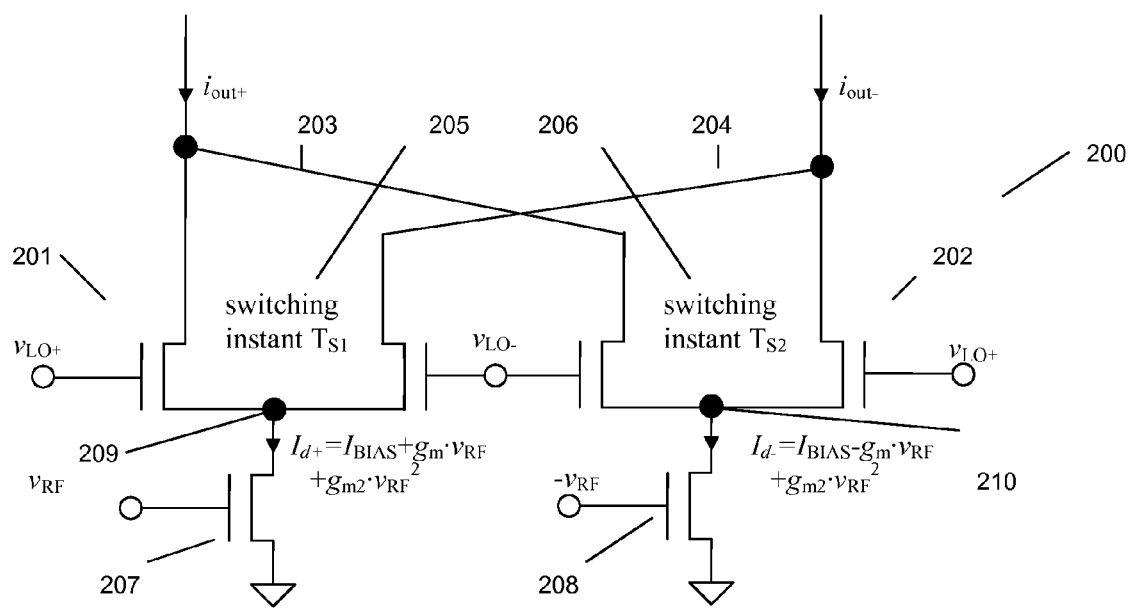
FIG. 2: shows a double balanced mixer.

FIG. 2 shows a double balanced mixer 200. It consists of two single balanced mixers 201, 202 with cross-coupled positive or negative output 203, 204, respectively. It is assumed that due to parameter mismatches the switching instants of the two switching pairs 205, 206 in it are not identical as well, whereas for the sake of simplicity it is assumed that the RF-input transistors 207, 208 are matched. Each individual single-balanced mixer puts out an undesired LF current, which can be computed from Eq. (1). The total undesired LF-current for the double balanced mixer then computes as the sum of both individual undesired currents and will be:

$$i_{undesired} = g_{m2} \cdot LP\{v_{rf}^2\} \frac{T_{s2} - T_{s1}}{T},$$

where $T_{S2}$ and $T_{S1}$ are the individual switching instants which both deviate from T/2 in a random fashion.

For both the single and double balanced mixer IM2 develops in the RF-input transistors 207, 208 and then leaks into the output through mismatches in the switching transistors 205, 206. Namely, the IM2 is comprised by the drain current 209, 210 of the RF-input transistors. If the IM2 is removed from it before it enters the switches a substantial improvement of IIP2 can be achieved. IIP2 is the second order intercept point, the level of input signal at which the IM2 at the output is as high as the direct signal when a two-tone test is applied. In decibels it is S_out−IM2=IIP2−S_in, where S_out is the output level, and S_in the input level.

It can be seen that, through Kirchhoff's current law, the output common mode of the mixer is identical to the common mode of the drain currents of the RF-transistors. For instance, if no means to reduce it are taken in a double-balanced gilbert mixer the output common mode is going to be:

$$i_{outcm} = 0.5 (i_{out+} + i_{out-}) = 0.5 \cdot (I_{BIAS} + g_m \cdot v_{rf} + g_{m2} \cdot v_{rf}^2 + I_{BIAS} - g_m \cdot v_{rf} + g_{m2} \cdot LP v_{rf}^2).$$

Whereas odd-order distortion cancels out from the common-mode even order distortion contributes fully to it. Except for the DC the output common mode (CM) current hence comprises only the undesired IM2 which is identical to that flowing into the switching pair.

Figure 3:
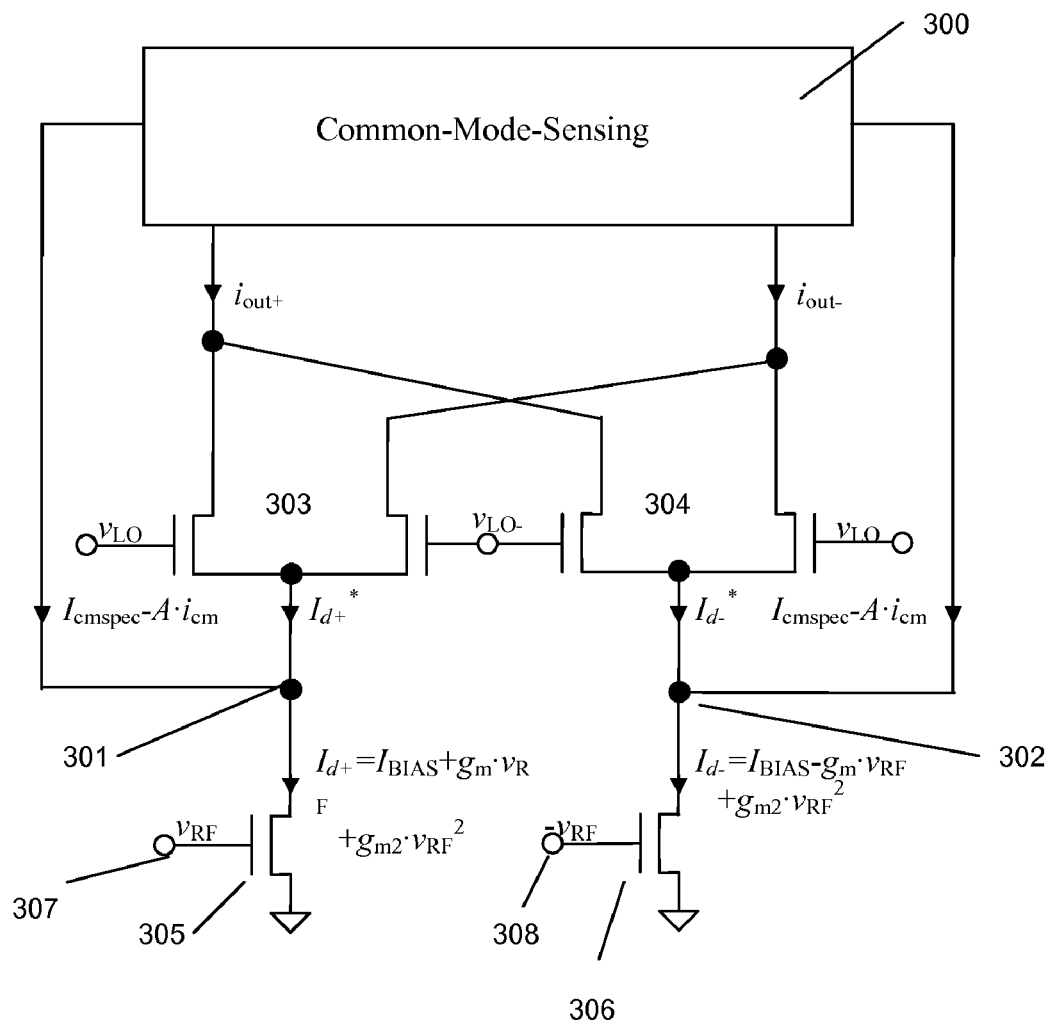
FIG. 3: shows a mixer in accordance with an embodiment of the invention.

FIG. 3 shows a double balanced mixer which includes an embodiment of the invention which removes second order distortion before it can leak into output differential mode (DM). The deviation of the output common mode from a specified CM-current, which is denoted $I_{cmspec}$, is sensed, amplified by a factor of A within component 300 and then subtracted from the drain-currents 301, 302 of the RF-transistors. Instead of their drain currents $I_{d+}$ and $I_{d-}$ corrected drain currents $I_{d+}^*$ and $I_{d+}^*$ are now flowing into the switching pairs 303, 304. The CM of the corrected currents will now be $$0.5 \cdot (I_{d+}^* + I_{d-}^*) = I_{cmspec} + \frac{1}{1+A}(I_{BIAS} + g_{m2} v_{rf}^2)$$

Hence the IM2 flowing into the switching pair is reduced by a factor $(1+A)^{-1}$ assuming the matching between the RF-input transistors is good. The IM2 at the output of the mixers (currents $i_{out+}$ and $i_{out-}$) will be reduced by the same amount.

FIG. 3 shows an implementation where the drain current is corrected directly through a subtraction of a correction current from the drains of the RF-transistors 305, 306. It will be appreciated that the correction could also be performed indirectly by influencing the gate-source voltage 307, 308 of the RF-input transistors.

Figure 4:
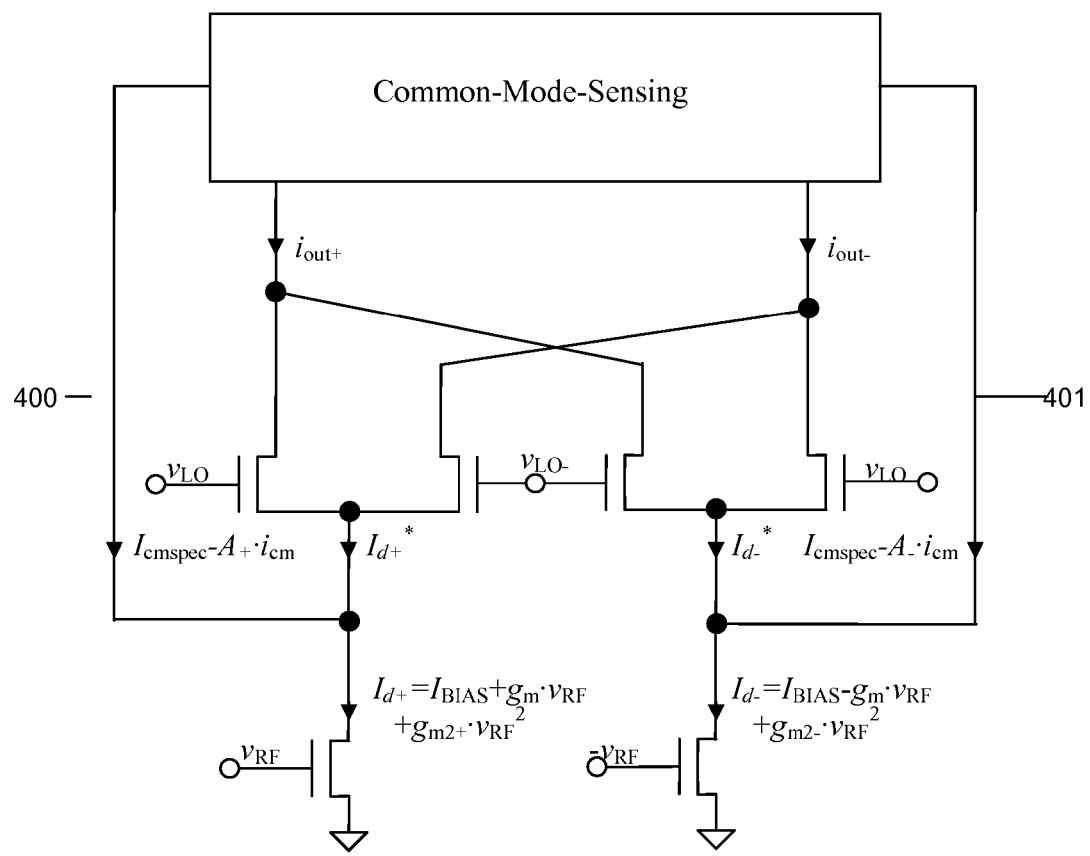
FIG. 4: shows a mixer in accordance with an embodiment of the invention with mismatched gains $A_+$ and $A_-$ to reduce IM2 due to mismatched $g_{m2+}$ and $g_{m2-}$.

In the embodiment described above perfect matching between the RF-input transistors is assumed and mismatches occur only in the switching transistors. Practically, this may not be the case. Hence, even after removing IM2 from their drain current's CM in their differential mode output IM2 still may exist due to mismatched $g_{m2}$. In an alternative embodiment of the invention the still existent IM2 may be removed by deliberately mismatching the gains (A+ and A−) in the feedback paths 400, 401 as shown in FIG. 4.

Figure 5:
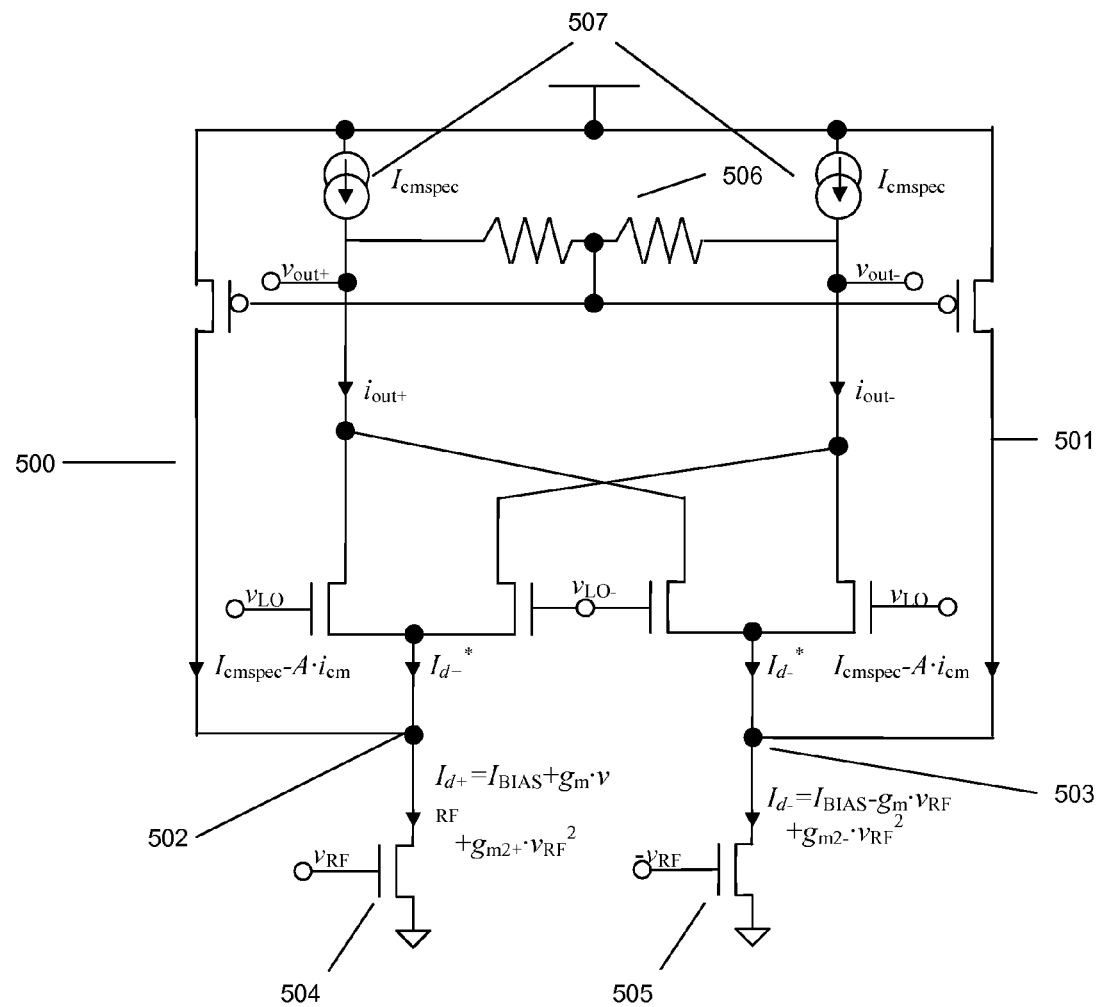
FIG. 5: shows a mixer in accordance with an embodiment of the invention with a resistive divider connected to PMOS-transistors.

FIG. 5 shows an embodiment of the invention where the CM-feedback 500, 501 to the drain-nodes 502, 503 of the RF-input transistors 504, 505 is established by using a resistive divider 506 and PMOS-transistors 507. The advantage of this implementation is simplicity. The disadvantage is that it may make the CM of the output voltage ($v_{out+} - v_{out-}$) VDD-dependent.

Figure 6:
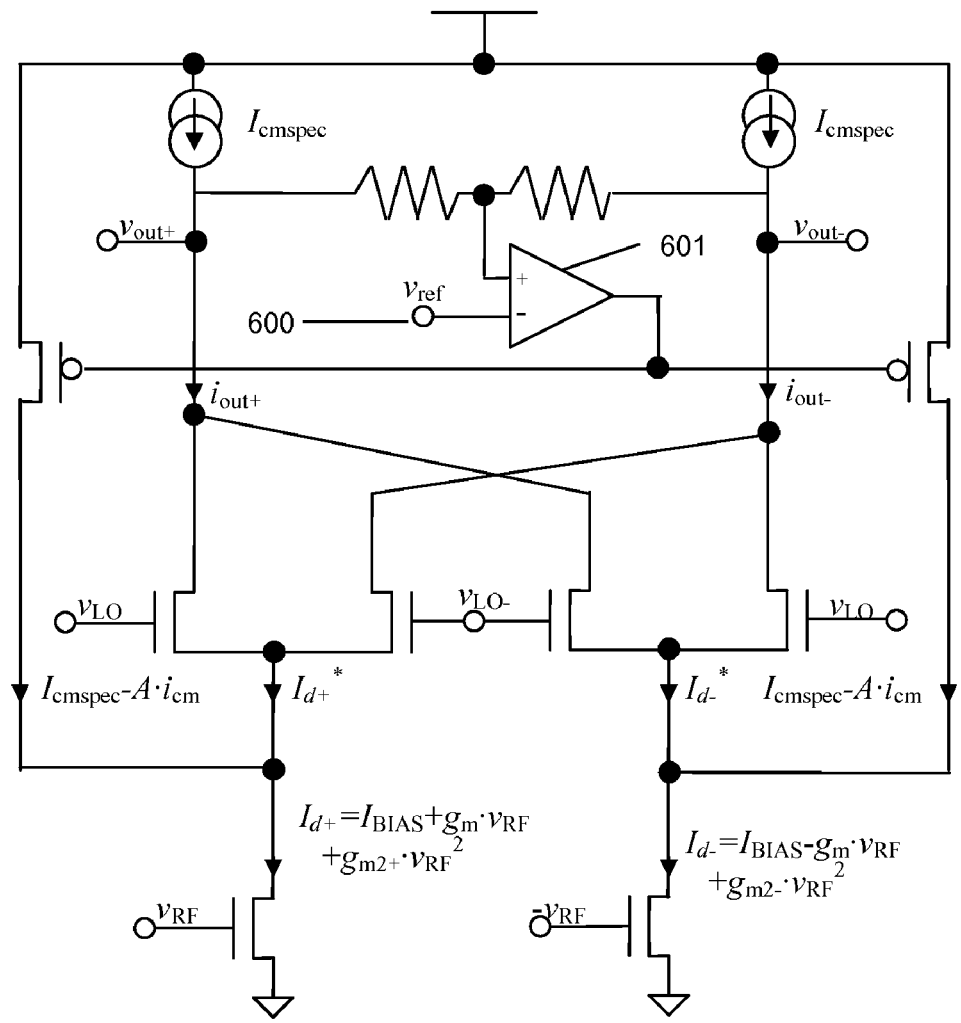
FIG. 6: shows a mixer in accordance with an embodiment of the invention using an operational amplifier to achieve a higher open-loop gain and to obtain less sensitivity to VDD-variations.

FIG. 6 shows an embodiment of the invention where the CM of the output voltage is compared to a defined reference voltage 600 (which is ground-referenced). Therefore the output CM is no longer dependent on VDD. The disadvantage is that the operational amplifier 601 may destabilize the control-loop by its phase-shifts.

It will be appreciated that although embodiments of the invention are shown in relation to a double balanced Gilbert mixer the invention is applicable to other types of mixers with suitable modification, such as a single balanced mixer where only one switching pair and one RF transistor is used.

One potential advantage of embodiments of the present invention is that the removal of the CM from the drain-current of the RF-input transistors results in a significant reduction of IM2. According to simulation results the input referred second order intercept point (IIP2) of the mixer rises by approximately 40 dB through the application of this invention.

A further potential advantage of embodiments of the present invention is that the invention provides means to control the output-CM of the mixer at the same time with the IM2-suppression. As a CM-loop has to be implemented anyway the implementation of the invention comes at no additional effort.

A further potential advantage of embodiments of the present invention is that the invention permits low odd-order distortion (e.g. IM3). Even though the invention would cover concepts that remove second order distortion from the drain current indirectly by influencing the gate-source-voltage of the RF-input transistors such concepts would lower the gate-source voltage at high input amplitudes. Thereby their transconductance would lower such that a gain compression (as indication of odd-order distortion) would occur much sooner than in the example given in FIG. 3. By leaving the source-nodes of the RF-input transistors connected to the negative supply rail the transistors are allowed to increase their DC-current for high RF-input-voltages hence easily handling amplitudes as large as their saturation voltage.

A further potential advantage of embodiments of the present invention is that it is able to reduce IM2 without the use of coils and thus is particularly useful where there are area constraints. In addition, embodiments of the present invention avoid the problem where the use of coils results in lowering the drain impedance of the RF transistors, thereby reducing the achievable conversion gain.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

The invention claimed is:

1. A mixer for downconversion of RF signals, comprising:
    at least two RF transistors;
    at least one switching pair connected to the drain current of each of the at least two RF transistors;
    a common mode sensing component configured to detect deviations in the common mode output of each of the at least one switching pair from a specified output; and
    at least one feedback path from the common mode sensing component to the drain current of each of the at least two RF transistors; wherein
    each of the at least one feedback paths are configured to subtract the deviations from the respective drain currents of the at least two RF transistors, and the gain of each feedback path are mismatched to each other.

2. A mixer as claimed in claim 1 further comprising an amplifier configured to amplify the deviations before the deviations are subtracted from the drain currents.

3. A mixer as claimed in claim 1 wherein the deviations are directly subtracted from the drain currents of the at least two RF transistors.

4. A mixer as claimed in claim 1 wherein each feedback path is configured to modify the gate-source voltage of each one of the respective at least two RF transistors.

5. A mixer as claimed in claim 1 wherein the common mode sensing component comprises a resistive divider and a PMOS-transistor.

6. A mixer as claimed in claim 1 wherein the specified output is a ground reference defined voltage.

7. A method for reducing second order distortion in a downconversion mixer, including the steps of:
    detecting deviations in the common mode output of each of at least two switching pairs from a specified output using a common mode sensing component; and
    subtracting deviations from drain currents of each of at least two RF transistors connected to each of the at least two switching pairs using at least one feedback path from the common mode sensing component to the drain current of each of the at least two RF transistors, wherein the gains of each feedback path are mismatched to each other.

* * * * *